United States Patent
Gu

(10) Patent No.: US 7,177,372 B2
(45) Date of Patent: Feb. 13, 2007

(54) METHOD AND APPARATUS TO REMOVE EFFECTS OF I-Q IMBALANCES OF QUADRATURE MODULATORS AND DEMODULATORS IN A MULTI-CARRIER SYSTEM

(76) Inventor: Jian Gu, 11843 Meriden La., San Diego, CA (US) 92128

( * ) Notice: Subject to any disclaimer, the term of this patent is extended or adjusted under 35 U.S.C. 154(b) by 1091 days.

(21) Appl. No.: 09/922,019

(22) Filed: Aug. 2, 2001

(65) Prior Publication Data

US 2003/0035470 A1 Feb. 20, 2003

Related U.S. Application Data

(60) Provisional application No. 60/262,804, filed on Jan. 19, 2001, provisional application No. 60/258,111, filed on Dec. 26, 2000, provisional application No. 60/257,697, filed on Dec. 21, 2000.

(51) Int. Cl.
*H04L 27/00* (2006.01)

(52) U.S. Cl. .................... 375/316; 375/296; 455/114.3

(58) Field of Classification Search ........ 375/259–260, 375/261, 285, 295–296, 316–317, 319, 344; 455/114.2, 114.3, 119, 232.1; 370/206, 210, 370/208
See application file for complete search history.

(56) References Cited

U.S. PATENT DOCUMENTS

| | | | | |
|---|---|---|---|---|
| 5,705,949 A | * | 1/1998 | Alelyunas et al. | 329/304 |
| 5,726,973 A | * | 3/1998 | Isaksson | 370/203 |
| 6,298,096 B1 | | 10/2001 | Burgin | |
| 6,668,024 B1 | * | 12/2003 | Andre | 375/295 |
| 2002/0097812 A1 | * | 7/2002 | Wiss et al. | 375/316 |

OTHER PUBLICATIONS

Derwent, document No. 2002-520185, 1999 abstract.

* cited by examiner

*Primary Examiner*—Khanh Tran
(74) *Attorney, Agent, or Firm*—Blakely Sokoloff Taylor & Zafman LLP

(57) ABSTRACT

The present invention is a method and apparatus to remove the adverse effects due to the imbalance between in-phase (I) and quadrature (Q) channels for I-Q demodulators and modulators in multi-carrier systems. A first balancer generates a first balancing signal from a first signal of a first index corresponding to a first frequency. A first combiner combines the first balancing signal and a second signal of a second index corresponding to a second frequency. The second frequency is symmetrical to the first frequency with respect to a center frequency in a multi-carrier composite signal. The first combiner generates a first balanced signal corresponding to the second frequency.

66 Claims, 5 Drawing Sheets

METHOD AND APPARATUS TO REMOVE EFFECTS OF I-Q IMBALANCES OF QUADRATURE MODULATORS AND DEMODULATORS IN A MULTI-CARRIER SYSTEM

CROSS-REFERENCES TO RELATED APPLICATIONS

This application claims the benefit of U.S. Provisional Application Nos. 60/257,697 filed on Dec. 21, 2000, 60/258,111 filed on Dec. 26, 2000, and 60/262,804 filed Jan. 19, 2001.

FIELD OF THE INVENTION

This invention relates to communication systems. In particular, the invention relates to multi-carrier systems.

BACKGROUND OF THE INVENTION

A radio frequency (RF) communication system typically has a receiver and a transmitter. The transmitter includes a modulator to modulate a radio carrier with information or message and a power amplifier to emit the radio signal into open space. The receiver has RF stages that converts the received radio signal into some appropriate intermediate Frequency (IF) signal and a demodulator that converts the IF signal into a baseband signal and recovers the embedded modulating information in the received signal sent by the transmitter. In a multi-carrier system, the transmitted radio signal consists of a number of signals each of which has a sub-carrier frequency and carries independent information. The sub-carrier frequencies are spaced with a fixed constant such that the sub-carrier frequencies are orthogonal each other over a certain given symbol duration. The sub-carrier frequencies are usually symmetrical around the center frequency which is the radio carrier frequency for a radio multi-carrier signal or is 0 Hz or DC for a baseband multi-carrier signal.

Typically, the processing of the signals in the transmitter or receiver involves use of quadrature modulation or demodulation, respectively. For a quadrature demodulator, the received signal is down-converted into a complex baseband signal by in-phase (I) and quadrature (Q) mixers and the baseband signal is split into in-phase (I) and quadrature (Q) components to be processed separately in the respective I and Q channels. These two components are then usually filtered and converted into digital samples. For a quadrature modulator, a reverse procedure is carried out. In real systems, there are a number of problems associated with the processing of the signals, which result in poor performance. These problems include mismatch or imbalance in gain or group delays between the I and Q channels. As a result, the sub-carrier signals in a multi-carrier system may not completely satisfy the orthogonality over the symbol duration. These problems introduce cross-talks between the sub-carriers and distortion in the received or transmitted signals.

Therefore, there is a need to have an efficient technique to remove the adverse effects of the I-Q imbalances in a multi-carrier system.

BRIEF DESCRIPTION OF THE DRAWINGS

The features and advantages of the present invention will become apparent from the following detailed description of the present invention in which.

DETAILED DESCRIPTION OF THE INVENTION

In the following description, for purposes of explanation, numerous details are set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention. It is also noted that the invention may be described as a process, which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Figure 1:
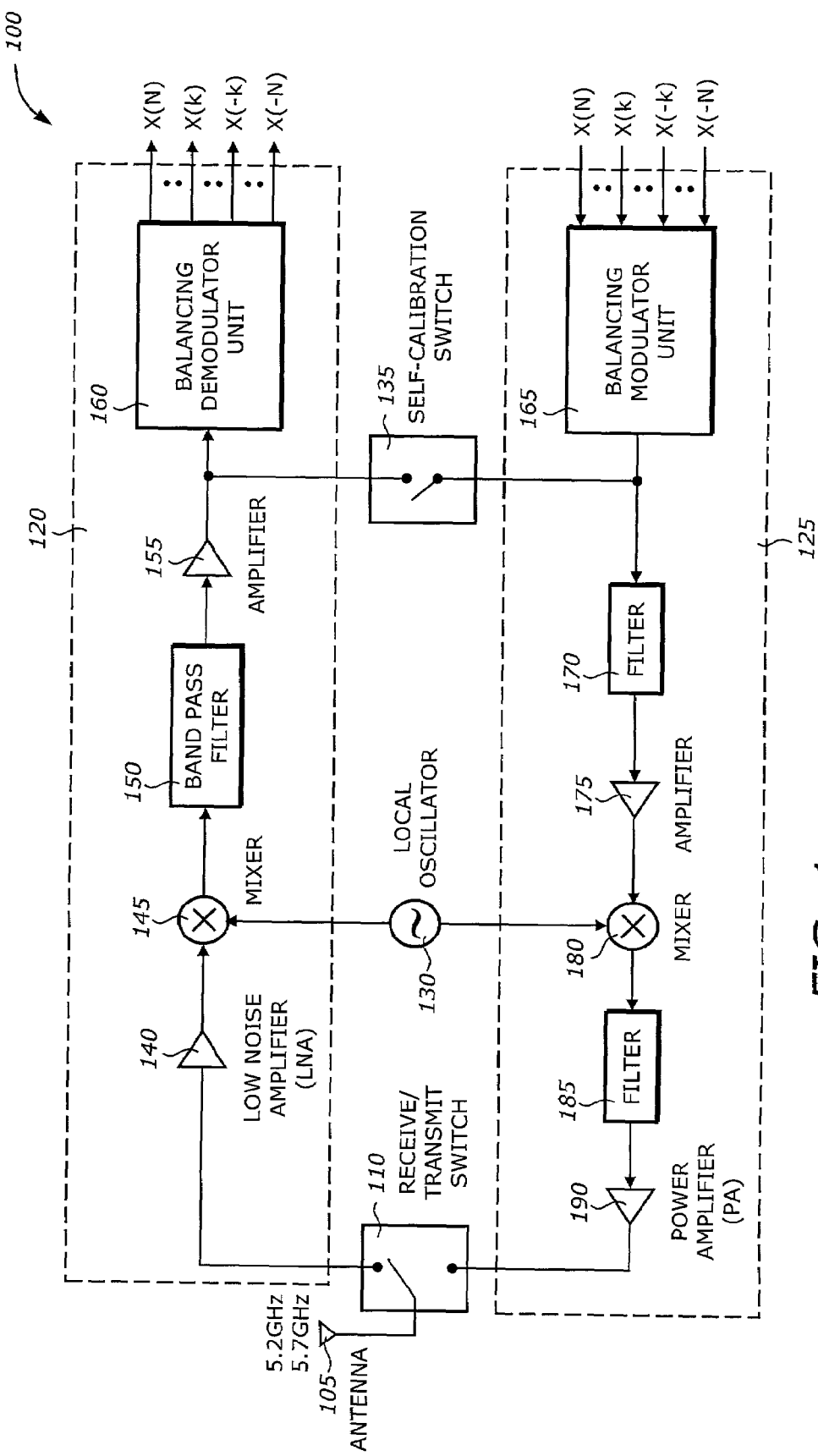
FIG. 1 is a diagram illustrating a system in which one embodiment of the invention can be practiced.

FIG. 1 is a diagram illustrating a system 100 in which one embodiment of the invention can be practiced. The system 100 may be a wireless communication system or any communication system with similar characteristics. The system 100 includes an antenna 105, a receive/transmit switch 110, a receiver 120, a transmitter 125, a local oscillator 130, and a self-calibration switch 135. Not all of the elements are required for the system 100.

The antenna 105 receives and transmits radio frequency signal. In one embodiment, the received and transmitted signals are in a frequency range of 5.2 GHz–5.7 GHz. The received and transmitted signals are multi-carrier signals having a number of sub-carriers. Each of the multi-carrier signals is a composite signal consisting of sub-carrier signals at a number of sub-carrier frequencies. The sub-carriers are separated by a fixed frequency separation. The receive/transmit switch 110 connects the antenna to the receiver 120 or the transmitter 125 depending on whether the system 100 is in the receive mode or transmit mode, respectively. When the system 100 is configured as either a receiver or a transmitter, the receive/transmit switch 110 is not needed. The local oscillator 130 generates oscillating signal at an appropriate frequency to down convert the received signal to baseband for the receiver 120, or to up convert the baseband signal to appropriate transmission frequency for the transmitter 125. The self-calibration switch 135 is used for self-calibration or training. The self-calibration switch 135 is open in normal operation when the receiver 120 and the transmitter 125 operate independently. The self-calibration switch 135 is closed to allow locally generated signals to be processed by the receiver 120 during training. Alternatively, the self-calibration switch 135 is not needed and the training can be performed with a remote transmitter.

The receiver 120 processes the received signal, which carries the multi-carrier baseband signal $$Y(t) = \sum_{k=-N}^{N} X(k) \cdot \exp(j2\pi k \Delta_F t)$$

plus some noise and distortion if any and recovers the original modulating signals $X(-N), \ldots, X(-k), \ldots, X(k), \ldots,$ and $X(N)$, indexed by integers $-N, \ldots -k, \ldots k, \ldots, N$, where the k-th signal corresponds to the original signal from the k-th sub-carrier modulator whose sub-carrier frequency is $k\Delta_F$ higher than the center frequency of the multi-carrier signal (while index $-k$ means $k\Delta_F$ lower than the center frequency). The index 0 corresponds to a center frequency of the composite multi-carrier signal which is 0 Hz for the complex baseband signal and can be any radio frequency if the baseband signal is up-converted to any radio frequency band. The receiver includes a low noise amplifier (LNA) 140, a mixer 145, a band-pass filter (BFP) 150, an amplifier/buffer 155, and a balancing demodulator unit 160. The LNA 140 amplifies the received signal with low noise. The mixer 145 acts like an analog multiplier to multiply the received signal with the oscillating signal from the local oscillator 130. The band pass filter 150 filters the multiplied signal to allow signal at the desired pass band centered at an intermediate frequency (IF) ω to pass through. The amplifier 155 amplifies the band-passed signal with appropriate gain for further processing. The balancing demodulator unit 160 performs the final demodulation to separate the composite base-band signal into the original signals $X(-N), \ldots, X(-k), \ldots, X(k), \ldots,$ and $X(N)$ at appropriate sub carrier frequencies The transmitter 125 processes the mutually independent original signals $X(-N), \ldots, X(-k), \ldots, X(k), \ldots,$ and $X(N)$ indexed by $-N, \ldots, -k, \ldots, k, \ldots, N$, and generates a composite signal for transmission. The transmitter 125 includes a balanced modulator unit 165, a filter 170, an amplifier 175, a mixer 180, a band-pass filter (BPF) 185, and a power amplifier 190. The balanced modulator unit 165 receives the original signals at suitable sub-carrier frequencies. It generates a composite signal to the filter 170. The filter 170 eliminates unwanted spectral components. The amplifier 175 amplifies the signal with suitable gain. The mixer 180 acts like an analog multiplier to multiply the signal with the local oscillator 130. The band pass filter 185 allows the signal at the frequency band of interest to pass through. The PA 190 amplifies the band-passed signal with proper power. The final signal goes to the receive/transmit switch 110 to be transmitted.

Figure 2:
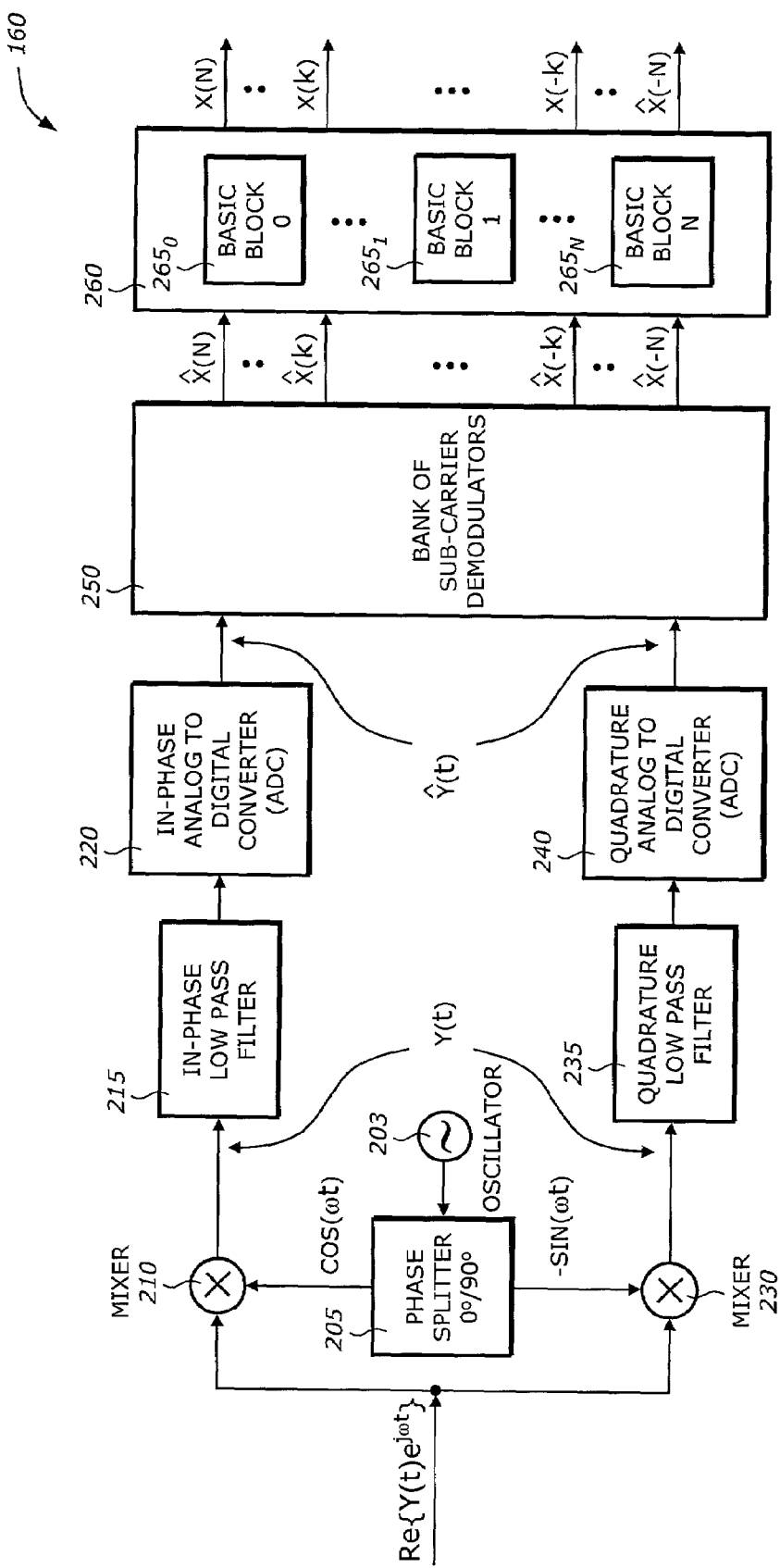
FIG. 2 is a diagram illustrating a balanced demodulator unit shown in FIG. 1 according to one embodiment of the invention.

FIG. 2 is a diagram illustrating the balancing demodulator unit 160 shown in FIG. 1 according to one embodiment of the invention. The balancing demodulator unit 160 includes a local oscillator 203, a phase splitter 205, an in-phase (I) mixer 210, an in-phase low-pass filter (LPF) 215, an in-phase analog-to-digital converter (ADC) 220, a quadrature (Q) mixer 230, a quadrature LPF 235, a quadrature ADC 240, a bank of sub-carrier demodulators 250, and a demodulator balancing block 260.

The phase splitter 205 generates cosine and sine waveforms at the intermediate frequency ω provided by the local oscillator 203. The cosine and sine waveforms are ideally orthogonal. As will be explained later, if they are not orthogonal, the resulting non-balanced demodulated signals may have distortion. The I and Q mixers 210 and 230 act like analog multipliers to multiply the input signal with the cos(ωt) and −sin(ωt) to essentially convert the input signal to the base-band frequency. The I and Q LPFs 215 and 235 filter out the high frequency spectral components of the corresponding mixed signal to allow the signal at base-band to pass through. The I and Q ADCs 220 and 240 convert the base-band signal to digital samples.

However, due to variations in manufacturing process for analog components such as mixers, filters, and ADCs/DACs, the overall frequency/group delay and gain response of the I channel may be different from that of the Q channel and the local reference signals to the I-Q mixers may not be orthogonal (90 degrees in phase). They are called I-Q mismatch or imbalance. Therefore, in FIG. 2, the complex signal at the output the I-Q channels $\hat{Y}(t)$ is a distorted version of Y(t). Similarly for the I-Q modulator in FIG. 3, if we were to apply $\hat{Y}(t)$ to the input of I-Q channels of the I-Q modulator, the resulted signal is the real part of $\hat{Y}(t)\exp(j\omega t)$ where Y(t) may be a distorted version of $\hat{Y}(t)$ due to I-Q imbalances.

The bank of sub-carrier demodulators 250 includes 2N+1 demodulators operating at sub-carrier frequencies separated by a fixed frequency separation $\Delta_F$. The bank 250 receive the digital I and Q samples and perform sub-carrier demodulation to generate 2N+1 non-balanced signals $\hat{X}(-N), \ldots, \hat{X}(-k), \ldots, \hat{X}(k), \ldots, \hat{X}(N)$. The k-th sub-carrier demodulator performs the function $$\hat{X}(k) = \frac{1}{T}\int_0^T \hat{Y}(t) \cdot \exp(-j2\pi k\Delta_F t)dt,$$

where T is the symbol duration for the input signal $\hat{Y}(t)$. Due to noise, imbalance in gain, and non-orthogonality of the mixers 210 and 230, the non-balanced signals may be distorted or exhibit cross-talk noise. The demodulator balancing block 260 compensates for the distortion or noise by balancing these effects. The demodulator balancing block 260 recovers the original signals and generates the original signals $X(-N), \ldots, X(-k), \ldots, X(k), \ldots, X(N)$. The demodulator balancing block 260 includes N+1 basic blocks $265_0, 265_1$ to $265_N$. The basic block $265_0$ processes $\hat{X}(0)$. Each of the N basic blocks from $265_1$ to $265_N$ processes a pair of non-balanced signals from the sub-carrier demodulators with indices symmetrical around index 0. In other words, each of the N basic blocks processes $\hat{X}(k)$ and $\hat{X}(-k)$ and generates X(k) and X(-k) up to differences of constant complex scales which can be removed by referencing to known pilot or training signals.

As is known by one skilled in the art, the techniques of the present invention are applicable to any other types of signal decomposition. The signal Y(t) may be represented by any method, including representation in the Fourier, Hilbert, and analytic domains. The sub-carrier signals may be components of the composite signal Y(t) as Fourier Transform elements, Fourier series expansion elements, complex envelope components, etc. Furthermore, the techniques may also be applicable or extended to signal crosstalks or distortions caused by reasons other than I-Q imbalances.

Figure 3:
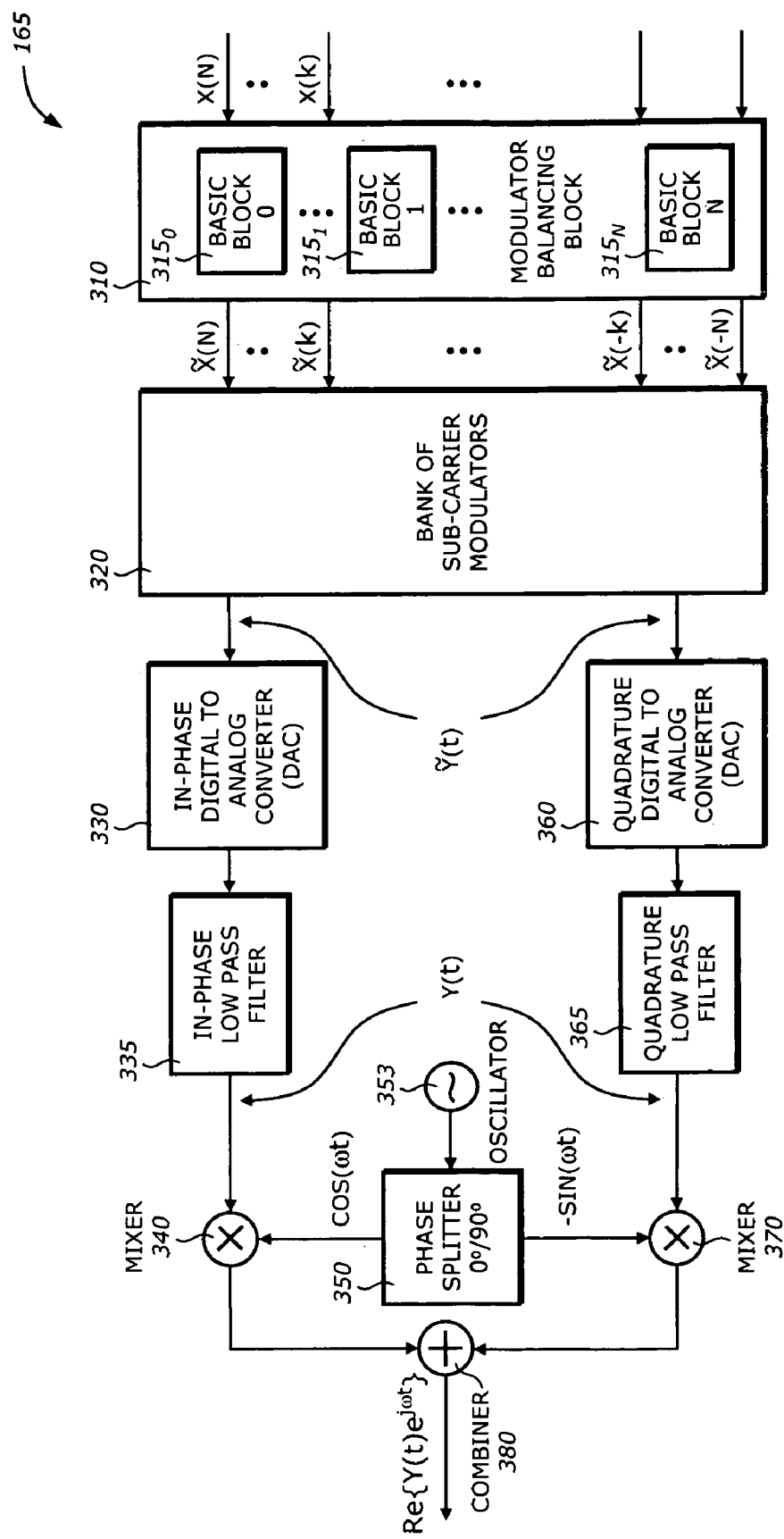
FIG. 3 is a diagram illustrating a balanced modulator unit shown in FIG. 1 according to one embodiment of the invention.

FIG. 3 is a diagram illustrating the balancing modulator unit 165 shown in FIG. 1 according to one embodiment of the invention. The balancing modulator unit 165 includes a modulator balancing block 310, a bank of sub-carrier modulators 320, I and Q digital-to-analog converters (DACs) 330 and 360, I and Q LPF 335 and 365, I and Q mixers 340 and 370, a phase splitter 350, a local oscillator 353, and a combiner 380.

The modulator balancing block 310 processes 2N+1 original modulating signals X(−N), . . . , X(−k), . . . , X(k), . . . , X(k), . . . , X(N). The modulator balancing block 310 generates 2N+1 pre-compensated signals $\tilde{X}(-N)$, . . . , $\tilde{X}(-k)$, . . . , $\tilde{X}(k)$, . . . , $\tilde{X}(N)$ to the bank of sub-carrier modulators 320 by compensating or balancing the effects due to imbalances in gain mismatch in the I and Q LPFs 335 and 365, phase non-orthogonality in the mixers 340 and 370. The modulator balancing block 310 includes N+1 basic blocks $315_0$, $315_1$ to $315_N$. The basic block $315_0$ processes X(0). Each of the basic blocks $315_1$ to $315_N$ processes a pair of signals X(−k) and X(k) having symmetrical indices around index 0. The bank of sub-carrier modulators 320 includes a number of complex sub-carrier modulators and combines the outputs of all sub-carrier modulators. A sub-carrier modulator at frequency $k\Delta_F$ generates $\tilde{X}(k) \cdot \exp(j2\pi k\Delta_F t)$ over a given symbol duration T. Therefore, the bank of sub-carrier modulators 320 generates a multi-carrier baseband signal $$\tilde{Y}(t) = \sum_{k=-N}^{N} \tilde{X}(k) \cdot \exp(j2\pi k\Delta_F t).$$

The real part and the imaginary part of $\tilde{Y}(t)$ become the I and Q components of the composite signal for the following DACs, low-pass filters and the I-Q modulator to be up-converted to a radio signal with a center angle frequency ω, respectively.

The I and Q DACs 330 and 360 convert the I and Q digital samples from the bank of sub-carrier modulators 320 into analog signals. The I and Q LPFs 335 and 365 filter the corresponding I and Q signals from the I and Q DACs 330 and 360. Any imbalance in gain in the I and Q LPFs 335 and 365 is balanced by the modulator balancing block 310. The I and Q mixers 340 and 370 mix the corresponding I and Q signals with the cos(ωt) and −sin(ωt) provided by the phase splitter 350 to generate signals at appropriate frequencies. The local oscillator 353 provides the frequency source to the phase splitter 350. The combiner 380 combines the I and Q signals into a composite signal to be transmitted.

Figure 4:
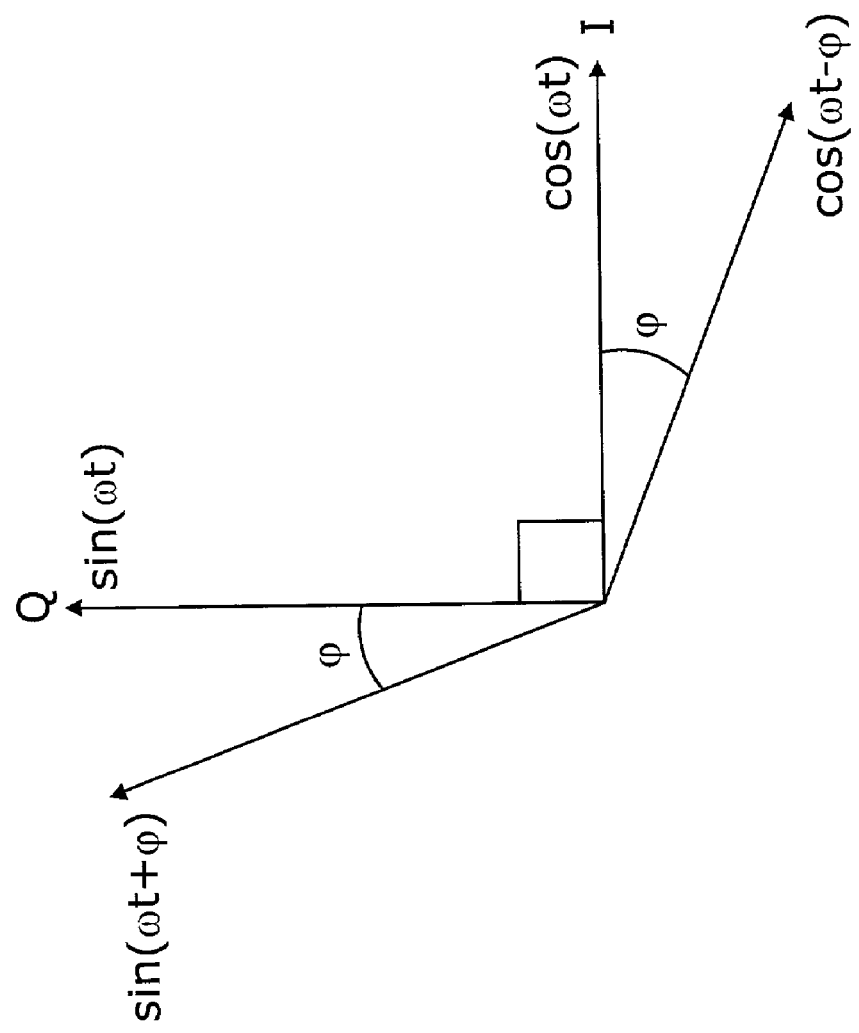
FIG. 4 is a diagram illustrating the in-phase and quadrature non-orthogonality according to one embodiment of the invention.

FIG. 4 is a diagram illustrating the in-phase and quadrature non-orthogonality according to one embodiment of the invention. It is noted that when this happens, the baseband component of the output of the I-Q mixers of the demodulator in FIG. 2 is no longer Y(t) and neither is the complex envelope of the output of the I-Q mixers of the modulator in FIG. 3.

As shown, in the ideal situation, the phase difference between the phase splitter used in the mixing of the I and Q channels is 90 degrees, such that the cos(ωt) and −sin(ωt) components are orthogonal. In practice, there is some amount of non-orthogonality caused by a phase deviation φ. The cos(ωt) and −sin(ωt) components become cos(ωt−φ) and −sin(ωt+φ), respectively. This phase deviation may cause signal distortion. The balancing blocks used in the modulator and demodulator also compensate for this phase deviation.

The balancing blocks are implemented based on derivation of the balancing parameters used in the balancing blocks and a training process to determine these parameters. The derivation is explained below.

Demodulator:

Refer to FIG. 2 showing a demodulator unit. Let ω be the radio carrier frequency and $\Delta_F$ be the frequency spacing between sub-carriers. Further, suppose that the sub-carriers satisfy the orthogonality over symbol duration T: i.e., $$\frac{1}{T}\int_0^T \exp(j2\pi m\Delta_F t)\exp(-j2\pi n\Delta_F t)dt = \begin{cases} 0, & m \neq n \\ 1, & m = n \end{cases} \quad (1)$$

The input signal of the demodulator is Re[Y(t)·exp(jω·t)] where Re[.] is the real part of complex variable and $$Y(t) = \sum_{k=-N}^{N} X(k) \cdot \exp(j2\pi k\Delta_F t)$$

is the modulated multi-carrier low-pass equivalent signal with {X(k) where k=−N, . . . , N, k is an integer} modulating the 2N+1 sub-carriers, respectively.

Suppose that in FIG. 2 the low-pass filters 215 and 235 have filter characteristics, or transfer functions, $H_I(\omega)$ and $H_Q(\omega)$, respectively. The effects of the ADCs 220 and 240 and other analog components along the I-channel or Q-channel may be included in the low-pass filters 215 and 235. Suppose the I and Q channels have gain and group delay profiles {$G_I(k)$, $\tau_I(k)$: k=0, . . . , N} and {$G_Q(k)$, $\tau_Q(k)$: k=0, . . . , N}, respectively. $G_I(k)$ and $\tau_I(k)$ are the gain and group delay of the I-channel at frequency $k\Delta_F$. $G_Q(k)$ and $\tau_Q(k)$ are the Q-channel gain and group delay at frequency $k\Delta_F$. Assume that $\tau_I(k)$, $\tau_Q(k)$, $G_I(k)$, and $G_Q(k)$ are almost constant over the frequency bandwidth $\Delta_F$ centered at frequency $k\Delta_F$. Define $\theta_I(k)=2\pi \cdot k\Delta_F \tau_I(k)+\theta_I(0)$ and $\theta_Q(k)=2\pi \cdot k\Delta_F \tau_Q(k)+\theta_Q(0)$ as the corresponding phase shifts at frequency $k\Delta_F$ due to the group delays of the LPFs 215 and 235, where $\theta_I(0)$ and $\theta_Q(0)$ are the phase shifts due to some fixed delay at frequency 0 (e.g., delay due to ADC and DAC processes).

Consider a situation with two sub-carriers. Let the baseband signal be $$Y(t)=X(k)\cdot\exp(j2\pi k\Delta_F t)+X(-k)\cdot\exp(-j2\pi k\Delta_F t) \quad (2)$$

for some k>0, where X(k)=A+jB and X(−k)=C+jD. For simplicity, define $\omega_k=2\pi k\Delta_F$, $G_I=G_I(k)$ and $G_Q=G_Q(k)$, $\theta_I=\theta_I(k)$ and $\theta_Q=\theta_I(k)$. Then, the signal after the ADCs 220 and 240 can be expressed as:

$$\hat{Y}(t) = G_I \cdot \text{Re}[X(k)\cdot\exp(j(\omega_k t - \theta_I)) + X(-k)\cdot \quad (3)$$
$$\exp(-j(\omega_k t - \theta_I)] +$$
$$jG_Q \cdot \text{Im}[X(k)\cdot\exp(j(\omega_k t - \theta_Q)) + X(-k)\cdot$$
$$\exp(-j(\omega_k t - \theta_Q)]$$
$$= G_I[A\cos(\omega_k t - \theta_I) - B\sin(\omega_k t - \theta_I)] +$$
$$jG_Q[B\cos(\omega_k t - \theta_Q) + A\sin(\omega_k t - \theta_Q)] +$$
$$G_I[C\cos(\omega_k t - \theta_I) + D\sin(\omega_k t - \theta_I)] +$$
$$jG_Q[D\cos(\omega_k t - \theta_Q) - C\sin(\omega_k t - \theta_Q)]$$
$$= G_I[A\cos(\omega_k t)\cos\theta_I + A\sin(\omega_k t)\sin\theta_I -$$

-continued $B \sin(\omega_k t)\cos\theta_I + B \cos(\omega_k t)\sin\theta_I] +$ $jG_Q[B \cos(\omega_k t)\cos\theta_Q + B \sin(\omega_k t)\sin\theta_Q +$ $A \sin(\omega_k t)\cos\theta_Q - A \cos(\omega_k t)\sin\theta_Q] +$ $G_I[C \cos(\omega_k t)\cos\theta_I + C \sin(\omega_k t)\sin\theta_I +$ $D \sin(\omega_k t)\cos\theta_I - D \cos(\omega_k t)\sin\theta_I] +$ $jG_Q[D \cos(\omega_k t)\cos\theta_Q + D \sin(\omega_k t)\sin\theta_Q -$ $C \sin(\omega_k t)\cos\theta_Q + C \cos(\omega_k t)\sin\theta_Q]$ $= G_I \cos\theta_I[A \cos(\omega_k t) - B \sin(\omega_k t)] +$ $G_I \sin\theta_I[A \sin(\omega_k t) + B \cos(\omega_k t)] +$ $jG_Q \cos\theta_Q[B \cos(\omega_k t) + A \sin(\omega_k t)] +$ $jG_Q \sin\theta_Q[B \sin(\omega_k t) - A \cos(\omega_k t)] +$ $G_I \cos\theta_I[C \cos(\omega_k t) + D \sin(\omega_k t)] +$ $G_I \sin\theta_I[C \sin(\omega_k t) - D \cos(\omega_k t)] +$ $jG_Q \cos\theta_Q[D \cos(\omega_k t) - C \sin(\omega_k t)] +$ $jG_Q \sin\theta_Q[D \sin(\omega_k t) + C \cos(\omega_k t)]$ where Re[.] is the real part of complex variable and Im[.] is the imaginary part of complex variable For any k>0, $\hat{X}(k)$ and $\hat{X}(-k)$ are the outputs of the corresponding sub-carrier demodulators and are calculated in the following, $$\hat{X}(k) = \frac{1}{T}\int_0^T \hat{Y}(t)(\cos(\omega_k t) - j\sin(\omega_k t))dt \qquad (4)$$

$= G_I \cos\theta_I[A+jB]/2 + G_I \sin\theta_I[-jA+B]/2 +$
$jG_Q \cos\theta_Q[B-jA]/2 + jG_Q \sin\theta_Q[-jB-A]/2 +$
$G_I \cos\theta_I[C-jD]/2 + G_I \sin\theta_I[-jC-D]/2 +$
$jG_Q \cos\theta_Q[D+jC]/2 + jG_Q \sin\theta_Q[-jD+C]/2$
$= G_I \cos\theta_I[A+jB]/2 - jG_I \sin\theta_I[A+jB]/2 +$
$G_Q \cos\theta_Q[A+jB]/2 - jG_Q \sin\theta_Q[A+jB]/2 +$
$G_I \cos\theta_I[C-jD]/2 - jG_I \sin\theta_I[C-jD]/2 +$
$-G_Q \cos\theta_Q[C-jD]/2 + jG_Q \sin\theta_Q[C-jD]/2$
$= [(G_I \cos\theta_I + G_Q \cos\theta_Q) -$
$j(G_I \sin\theta_I + G_Q \sin\theta_Q)](A+jB)/2 +$
$[(G_I \cos\theta_I - G_Q \cos\theta_Q) -$
$j(G_I \sin\theta_I - G_Q \sin\theta_Q)](C-jD)/2$ and $$\hat{X}(-k) = \frac{1}{T}\int_0^T \hat{Y}(t)(\cos(\omega_k t) + j\sin(\omega_k t))dt \qquad (5)$$

$= G_I \cos\theta_I[A-jB]/2 + G_I \sin\theta_I[jA+B]/2 +$
$jG_Q \cos\theta_Q[B+jA]/2 + jG_Q \sin\theta_Q[jB-A]/2 +$
$G_I \cos\theta_I[C+jD]/2 + G_I \sin\theta_I[jC-D]/2 +$
$jG_Q \cos\theta_Q[D-jC]/2 + jG_Q \sin\theta_Q[jD+C]/2$
$= G_I \cos\theta_I[A-jB]/2 + jG_I \sin\theta_I[A-jB]/2 +$
$-G_Q \cos\theta_Q[A-jB]/2 - jG_Q \sin\theta_Q[A-jB]/2 +$
$G_I \cos\theta_I[C+jD]/2 + jG_I \sin\theta_I[C+jD]/2 +$
$G_Q \cos\theta_Q[C+jD]/2 + jG_Q \sin\theta_Q[C+jD]/2$
$= [(G_I \cos\theta_I + G_Q \cos\theta_Q) +$
$j(G_I \sin\theta_I + G_Q \sin\theta_Q)](C+jB)/2 +$
$[(G_I \cos\theta_I - G_Q \cos\theta_Q) +$
$j(G_I \sin\theta_I - G_Q \sin\theta_Q)](A-jB)/2$ Define $G_c(k) = (G_I \cos\theta_I + G_Q \cos\theta_Q)/2$, $G_s(k) = (G_I \sin\theta_I + G_Q \sin\theta_Q)/2$, $\Delta_c(k) = (G_I \cos\theta_I - G_Q \cos\theta_Q)/2$, and $\Delta_s(k) = (G_I \sin\theta_I - G_Q \sin\theta_Q)/2$. Then $$\hat{X}(k) = (G_c(k) - jG_s(k))(A+jB) + (\Delta_c(k) - j\Delta_s(k))(C-jD) \qquad (6)$$

and $$\hat{X}(-k) = (G_c(k) + jG_s(k))(C+jD) + (\Delta_c(k) + j\Delta_s(k))(A-jB) \qquad (7)$$

For k=0 (i.e., one sub-carrier at 0 frequency) and X(0)=A+jB, there are $$\hat{Y}(t) = G_I \cdot Re[X(0)\cdot\exp(j(-\theta_I))] + jG_Q \cdot Im[X(0)\cdot\exp(j(-\theta_Q))]$$
$$= G_I[A \cos(\theta_I) + B \sin(\theta_I)] + jG_Q[B \cos(\theta_Q) - A \sin(\theta_Q)] \qquad (8)$$

and $$\hat{X}(0) = \frac{1}{T}\int_0^T \hat{Y}(t)dt \qquad (9)$$

$= G_I[A \cos\theta_I + B \sin\theta_I] + jG_Q[B \cos\theta - jA \sin\theta_Q]$ $= [G_I \cos\theta_I - jG_Q \sin\theta_Q]A + [G_I \sin\theta_I + jG_Q \cos\theta_Q]B$ $= [G_I \cos\theta_I - jG_Q \sin\theta_Q](X(0) + X^*(0))/2 +$
$[G_I \sin\theta_I + jG_Q \cos\theta_Q](X(0) - X^*(0))/2j$ $= [(G_I \cos\theta_I + G_Q \cos\theta_Q) - j(G_I \sin\theta_I +$
$G_Q \sin\theta_Q)]X(0)/2 +$
$[(G_I \cos\theta_I - G_Q \cos\theta_Q) + j(G_I \sin\theta_I -$
$G_Q \sin\theta_Q)]X^*(0)/2$ $= (G_c(0) - jG_s(0))X(0) + (\Delta_c(0) + j\Delta_s(0))X^*(0)$ Further, define $G_{cs}(k) = G_c(k) + jG_s(k)$ and $\Delta_{cs}(k) = (\Delta_c(k) + j\Delta_s(k))$ and recall X(k)=A+jB and X(-k)=C+jD for k>0. There are $$\hat{X}(k)=G*_{cs}(k)X(k)+\Delta*_{cs}(k)X*(-k) \tag{10}$$

and $$\hat{X}(-k)=G_{cs}(k)X(-k)+\Delta_{cs}(k)X*(k) \tag{11}$$

where $(\cdot)*$ takes the conjugate of the complex variables.

In general, suppose that there are two sets of balancing parameters $\{G_{cs}(k): k=0, \ldots, N\}$ and $\{\Delta_{cs}(k): k=0, \ldots, N\}$, where $$G_{cs}(k)=G_c(k)+jG_s(k) \text{ and } \Delta_{cs}(k)=(\Delta_c(k)+j\Delta_s(k)) \tag{12}$$

and $$G_c(k)=(G_I(k)\cos\theta_I(k)+G_Q(k)\cos\theta_Q(k))/2, \tag{13}$$

$$G_s(k)=(G_I(k)\sin\theta_I(k)+G_Q(k)\sin\theta_Q(k))/2, \tag{14}$$

$$\Delta_c(k)=(G_I(k)\cos\theta_I(k)-G_Q(k)\cos\theta_Q(k))/2, \tag{15}$$

and $$\Delta_s(k)=(G_I(k)\sin\theta_I(k)-G_Q(k)\sin\theta_Q(k))/2 \tag{16}$$

and $\theta_I(k)=2\pi \cdot k\Delta_F\tau_I(k)$ and $\theta_Q(k)=2\pi \cdot k\Delta_F\tau_Q(k)$. Then for any $k>0$, the outputs of the bank of sub-carrier demodulator 250 are $$\hat{X}(k)=G*_{cs}(k)X(k)+\Delta*_{cs}(k)X*(-k), \tag{17}$$

$$\hat{X}(-k)=G_{cs}(k)X(-k)+\Delta_{cs}(k)X*(k), \tag{18}$$

From the above:

$$\hat{X}(k)G*_{cs}(k)-(\Delta_{cs}\hat{X}(-k))*=[(G*_{cs}(k))^2]X(k), \tag{19}$$

$$\hat{X}(-k)G_{cs}(k)-(\Delta*_{cs}(k)\hat{X}(k))*=[(G_{cs}(k))^2-(\Delta_{cs}(k))^2]X(-k), \tag{20}$$

Once the parameters $G_{cs}(k)$ and $\Delta_{cs}(k)$ are known, $\{X(k): k=-N, \ldots, N\}$ can be recovered from $\{\hat{X}(k): k=-N, \ldots, N\}$ with the above operations that are the functions of the demodulator balancing block 260 in FIG. 2.

Refer to the modulator unit 165 shown in FIG. 3. The balancing modulator unit 165 generates $\text{Re}[Y(t)\cdot\exp(j\omega \cdot t)]$ where $$Y(t)=\sum_{k=-N}^{N} X(k)\cdot\exp(j2\pi k\Delta_F t)$$

and $\{X(k): k=-N, \ldots, N\}$ is a set of symbols modulating the 2N+1 sub-carriers, respectively. However, since the I and Q channels of the modulator may be mis-matched, it may be desirable to generate $$\tilde{Y}(t)=\sum_{k=-N}^{N} \tilde{X}(k)\exp(j2\pi k\Delta_F t)$$

at the input of the Digital-to-Analog Converters 330 and 360 of the I and Q channels so that at the outputs of the LPFs 335 and 365 of I and Q channels will be $$Y(t)=\sum_{k=-N}^{N} X(k)\cdot\exp(j2\pi k\Delta_F t).$$

According to equation (17) and (18), there are $$X(k)=G*_{cs}(k)\tilde{X}(k)+\Delta*_{cs}(k)\tilde{X}*(-k), \tag{21}$$

$$X(-k)=G_{cs}(k)\tilde{X}(-k)+\Delta_{cs}(k)\tilde{X}*(k), \tag{22}$$

Therefore, $$X(k)G*_{cs}(k)-(\Delta_{cs}X(-k))*=[(G*_{cs}(k))^2-(\Delta*_{cs}(k))^2]\tilde{X}(k), \tag{23}$$

$$X(-k)G_{cs}(k)-(\Delta*_{cs}(k)X(k))*=[(G_{cs}(k))^2-(\Delta_{cs}(k))^2]\tilde{X}(-k), \tag{24}$$

From the above equations, given the desired modulating symbols $\{X(k): k=-N, \ldots, N\}$, $\tilde{X}(k)$ and $\tilde{X}(-k)$ may be generated for the corresponding sub-carrier modulators by introducing "cross-talks" between $X(k)$ and $X(-k)$.

It is next to derive how to obtain the balancing parameters for the modulator and demodulator balancing blocks 260 (FIG. 2) and 310 (FIG. 3). There are two ways to do this. One is to train locally and one is to train with remote units. The local self training or self calibration technique for the demodulator block 260 uses the modulator in a system that has both modulator and demodulator.

The balancing modulator unit 165 is used to send out ideal signals to the balancing demodulator unit 160 by closing the self-calibration switch 135 (FIG. 1). The ideal signal can be used as a reference signal to obtain the balancing parameters for the balancing demodulator unit 160. To distinguish the parameters of modulator and demodulator, define $\{G_T(k): k=0, \ldots, N\}$ and $\{\Delta_T(k): k=0, \ldots, N\}$ for the parameters of the modulator and $\{G_R(k): k=0, \ldots, N\}$ and $\{\Delta_R(k): k=0, \ldots, N\}$ for the parameters of the demodulator. Now, rewrite (21), (22), (23) and (24) as $$X(k)=G*_T(k)\tilde{X}(k)+\Delta*_T(k)\tilde{X}*(-k), \tag{25}$$

$$X(-k)=G_T(k)\tilde{X}(-k)+\Delta_T(k)\tilde{X}*(k), \tag{26}$$

and $$X(k)-(\Delta_T(k)/G_T(k))*\cdot(X(-k))*=G*_T(k)[1-(\Delta*_T(k)/G*_T(k))^2]\tilde{X}(k)' \tag{27}$$

$$X(-k)-(\Delta_T(k)/G_T(k))\cdot(X(k))*=G_T(k)[1-(\Delta_T(k)/G_T(k))^2]\tilde{X}(-k)' \tag{28}$$

Suppose the demodulator is an ideal demodulator, i.e., the I and Q channels are perfectly matched, so that $\hat{X}(k)=C(k)X(k)$ and $\hat{X}(-k)=C(-k)X(-k)$ at the output of the bank of sub-carrier demodulator 250 (FIG. 2), where the complex numbers $C(k)$ and $C(-k)$ are the channel responses to the sub-carriers $\omega+\omega^k$ and $\omega-\omega_k$, respectively, which may be different if the transmission path includes some radio and intermediate frequency stages such as mixers, band-pass filters, and IF amplifiers. For local training or calibration shown in FIG. 1, $C(k)=C(-k)=c_k$. This demodulator is used to demodulate the signal sent by the balancing modulator unit 165 to be balanced. This training procedure may be carried out as follows:

Step A: let $\{\tilde{X}(k),\tilde{X}(-k)\}=\{a+j0, 0+j0\}$ at the input of the modulator, which outputs $\text{Re}[Y(t)\cdot\exp(j\omega \cdot t)]$ with $Y(t)=X(k)\cdot\exp(j2\pi k\Delta_F t)+X(-k)\cdot\exp(-j2\pi k\Delta_F t)$. The corresponding output of the ideal demodulator will be $X1_{k=X(k)=ck}G*_T(k)$ and $X1_{-k}=X(-k)=c*_k\Delta_T(k)$.

Step B: Next, let $\{\tilde{X}(k),\tilde{X}(-k)\}=\{0+j0, a+j0\}$ at the modulator input. The corresponding outputs of the demodulator will be $X2_k=X(k)=c^*_k\Delta^*_T(k)$ and $X2_{-k}=X(-k)=c_k G_T(k)$.

Note that (0+j0) and (a+j0) are null and non-null complex numbers. The constant a may be any suitable number. In one embodiment, the constant a is unity ("1"). Furthermore, the non-null complex number can be any constant complex number since it does not change the ratio of $X1_{-k}/X1^*_k$ and $X2_k/X2^*_{-k}$.

Figure 5:
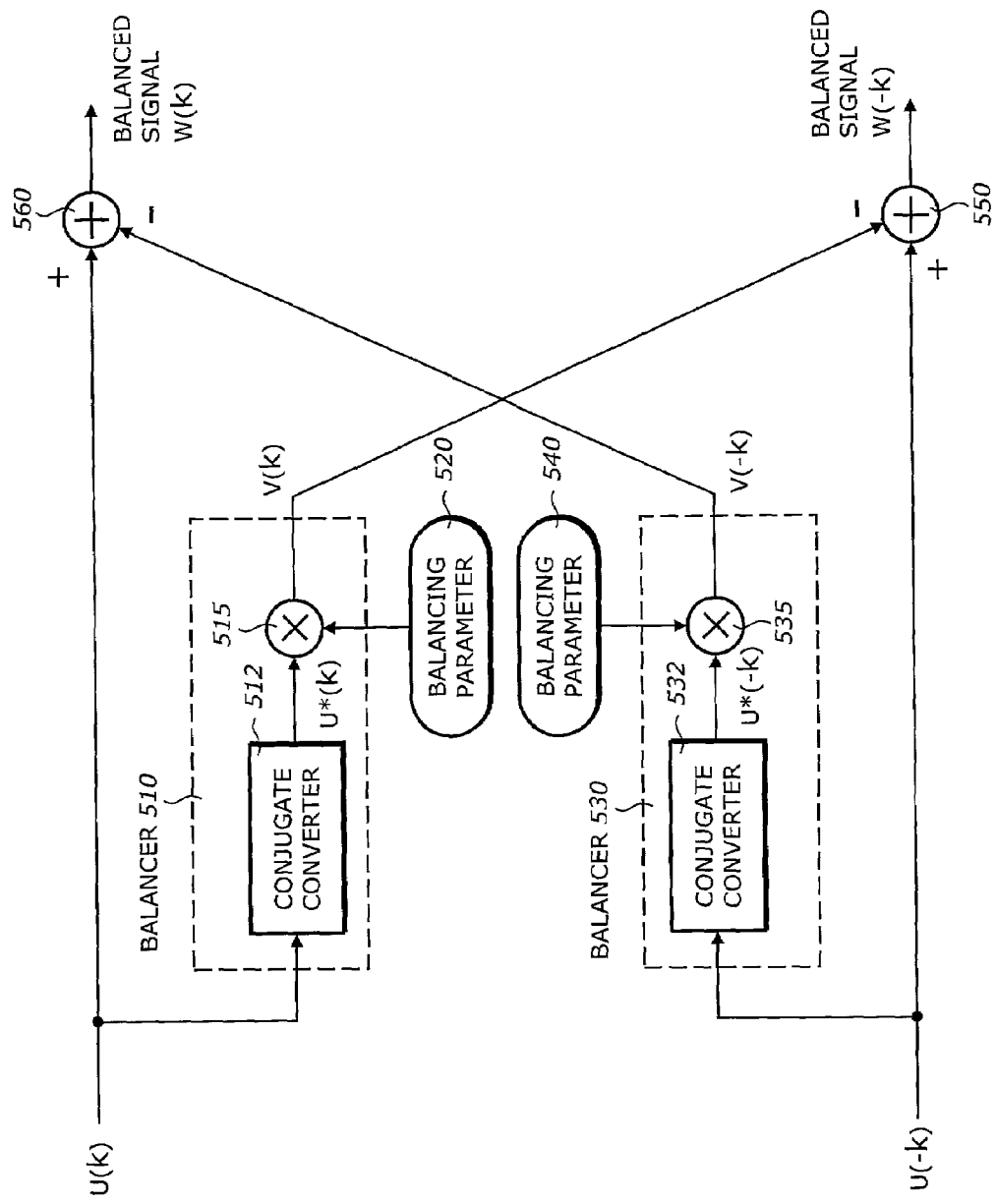
FIG. 5 is a diagram illustrating a basic balancing block shown in FIG. 1 according to one embodiment of the invention.

Combining the demodulation results from the above two steps, it can be shown that $X1_{-k}/X1^*_k=\Delta_T(k)/G_T(k)$ and $X2_k/X2^*_{-k}=\Delta^*_T(k)/G^*_T(k)$. The I-Q balancing blocks are shown in FIG. 5. The I-Q balancing blocks 315 ensure that the resulted modulated signal has no "cross-talks" between X(k) and X(-k) but there is a difference from the desired $\{X(k), X(-k)\}$ up to some constant complex scales which can be easily removed after further calibration or training.

Consider the situation when the demodulator is non-ideal or is not I-Q balanced. The same channel (I or Q) of the demodulator can be used to receive the signal from the modulator, assuming that the modulator and demodulator use I-Q reference signals ($\cos(\omega t)$ and $-\sin(\omega t)$) derived from the same reference oscillator. For example, I-channel of the demodulator is always used for training the modulator. The modulator will repeatedly transmit the same training signal twice for the training signal pair $\{\tilde{X}(k),\tilde{X}(-k)\}=\{a+j0, 0+j0\}$ while the reference signal of the I mixer will be $\cos(\omega t)$ during the first time training and $-\sin(\omega t)$ during the second time training. The results are that the I-channel output is the in-phase component of the transmitted signal in the first time training and the quadrature component in the second time training. Use buffer to store the samples of the I-channel output and then form complex samples by combining the two sets of samples in the buffer and post-process them to obtain desired parameters. Similar procedure can be performed for the training signal pair $\{\tilde{X}(k),\tilde{X}(-k)\}=\{0+j0,a+j0\}$.

Consider how to obtain balancing parameters for a I-Q mismatched demodulator. Assuming that a I-Q balanced modulator is available. This modulator is used to generate modulated signals at the input of the demodulator to be I-Q balanced. At the outputs of the bank of sub-carrier demodulators 250 (FIG. 2):

$$\hat{X}(k)=G^*_R(k)C(k)X(k)+\Delta^*_R(k)(C(-k)X(-k))^*, \quad (29)$$

$$\hat{X}(-k)=G_R(k)C(-k)X(-k)+\Delta_R(k)(C(k)X(k))^*, \quad (30)$$

where the complex numbers C(k) and C(-k) are the channel responses to the sub-carriers $\omega+\omega_k$ and $\omega-\omega_k$, respectively, which may be different (for remote training) if the transmission path includes some radio and intermediate frequency stages such as mixers, band-pass filters, and IF amplifiers.

If the modulator sends signals modulated with symbols $\{X(k),X(-k)\}=\{a+j0, 0+j0\}$, then, according to (29) and (30), at the output of the demodulator, there are $\hat{X}1_k=G^*_R(k)C(k)$ and $\hat{X}1_{-k}=\Delta_R(k)(C(k))^*$. Therefore, $\hat{X}1_{-k}/\hat{X}1^*_k=\Delta_R(k)/G_R(k)$.

Alternatively, the modulator may send $\{X(k),X(-k)\}=\{0+j0,a+j0\}$ and the outputs of the demodulator are $\hat{X}2_k=\Delta^*_R(k)(C(-k))^*$ and $\hat{X}2_{-k}=G_R(k)C(-k)$. Now we have $\hat{X}2_k/\hat{X}2^*_{-k}=\Delta^*_R(k)/G^*_R(k)$.

Once $\Delta_R(k)/G_R(k)$ or $\Delta^*_R(k)/G^*_R(k)$ is determined, the I-Q balancing block can be obtained up to some complex constants according to the following equations $$\hat{X}(k)-(\Delta_R(k)/G_R(k))^*\cdot$$
$$(\hat{X}(-k))^*=G^*_R(k)[1-(\Delta^*_R(k)/G^*_R(k))^2]X(k)' \quad (31)$$

$$\hat{X}(-k)-(\Delta_R(k)/G_R(k))\cdot$$
$$(\hat{X}(k))^*=G_R(k)[1-(\Delta_R(k)/G_R(k))^2]X(-k)' \quad (32)$$

Another approach to balancing a demodulator is to use some training signal sent remotely by an I-Q balanced modulator.

Non-Orthogonality at the I and Q Mixers:

The reference signals, $\cos(\omega t-\phi)$ and $-\sin(\omega t+\phi)$, for the I and Q mixers may not be orthogonal (i.e., the phase difference is not be 90 degrees if $\phi\neq 0$ as shown in FIG. 4), which may cause "cross-talks" between the In-phase component and the Quadrature component.

Let the base-band signal at the input of the I-Q demodulator be $$Re[Y(t)\cdot\exp(j\omega\cdot t)]=Re[Y(t)]\cos(\omega t)-Im[Y(t)]\sin(\omega t), \quad (33)$$

where Re[.] is the real part of complex variable and Im[.] is the imaginary part of complex variable. Then at the I and Q mixer outputs, the complex representation of the signal is $$Re[Y(t)]\cos\phi-Im[Y(t)]\sin\phi+j(Im[Y(t)]\cos\phi-Re[Y(t)]\sin\phi), \quad (34)$$

where the terms of frequency higher than the carrier frequency are omitted.

Define an operator $\mathfrak{I}_{G,\theta}$ such that $\mathfrak{I}_{G,\theta}(.)$ means multiplying G and introducing phase offset θ to the argument. Let $G_I$ and $\theta_I$ be the profile of the I-Channel and let $G_Q$ and $\theta_Q$ be profile of the Q-channel, then in FIG. 2, $$\hat{Y}(t) = \mathfrak{I}_{G_I,\theta_I}(\text{Re}[Y(t)]\cos\varphi - \text{Im}[Y(t)]\sin\varphi + \quad (35)$$
$$j\mathfrak{I}_{G_Q,\theta_Q}((\text{Im}[Y(t)]\cos\varphi - \text{Re}[Y(t)]\sin\varphi))$$
$$= \cos\varphi\cdot\{\mathfrak{I}_{G_I,\theta_I}(\text{Re}[Y(t)]) + j\mathfrak{I}_{G_Q,\theta_Q}(\text{Im}[Y(t)])\} -$$
$$j\sin\varphi\cdot\{\mathfrak{I}_{G_Q,\theta_Q}(\text{Re}[Y(t)]) - j\mathfrak{I}_{G_I,\theta_I}(\text{Im}[Y(t)])\}$$
$$= \cos\varphi\cdot\{\mathfrak{I}_{G_I,\theta_I}(\text{Re}[Y(t)]) + j\mathfrak{I}_{G_Q,\theta_Q}(\text{Im}[Y(t)])\} -$$
$$j\sin\varphi\cdot\{\mathfrak{I}_{G_Q,\theta_Q}(\text{Re}[Y(t)]) - j\mathfrak{I}_{-G_I,\theta_I}(\text{Im}[Y(t)])\}$$
$$= \cos\varphi\cdot\hat{Y}_1(t) - j\sin\varphi\cdot\hat{Y}_2(t),$$

where in the second braces—$\mathfrak{I}_{G_I,\theta_I}=\mathfrak{I}_{-G_I,\theta_I}$ is used. The results derived previously can be applied to the terms in the first braces and second braces individually, with different gain and group delay profiles which will result in corresponding balancing parameters.

Consider the situation with two sub-carriers in the above formula and $Y(t)=X(k)\cdot\exp(j2\pi k\Delta_F t)+X(-k)\cdot\exp(-j2\pi k\Delta_F t)$ for some k>0. Note that now $G_I=G_I(k)$, $G_Q=G_Q(k)$, $\theta_I=\theta_I(k)$ and $\theta_Q=\theta_Q(k)$ at the frequency $k\Delta_F$. Apply the results derive above to $\hat{Y}_1(t)$ and $\hat{Y}_2(t)$ and let the "balancing parameters" for $\hat{Y}_1(t)$ and $\hat{Y}_2(t)$ be $\{G_1(k), \Delta_1(k)\}$ and $\{G_2(k), \Delta_2(k)\}$, respectively. For example, $$G_1(k)=G_c(k)+jG_s(k) \text{ and } \Delta_1(k)=(\Delta_c(k)+j\Delta_s(k)) \quad (36)$$

with $$G_c(k)=(G_I(k)\cos\theta_I(k)+G_Q(k)\cos\theta_Q(k))/2, \quad (37)$$

$$G_s(k)=(G_I(k)\sin\theta_I(k)+G_Q(k)\sin\theta_Q(k))/2, \quad (38)$$

$$\Delta_c(k)=(G_I(k)\cos\theta_I(k)-G_Q(k)\cos\theta_Q(k))/2, \quad (39)$$

and $$\Delta_s(k)=(G_I(k)\sin\theta_I(k)-G_Q(k)\sin\theta_Q(k))/2, \qquad (40)$$

etc.

Then, let $\omega_k=2\pi k\Delta_F$, $$\hat{X}(k) = \frac{1}{T}\int_0^T \hat{Y}(t)(\cos\omega_k t - j\sin\omega_k t)dt \qquad (41)$$

$$= \frac{1}{T}\int_0^T (\cos\varphi \cdot \hat{Y}_1(t) - j\sin\varphi \cdot \hat{Y}_2(t))$$

$$(\cos\omega_k t - j\sin\omega_k t)dt$$

$$= \cos\varphi \cdot \hat{X}_1(k) - j\sin\varphi \cdot \hat{X}_2(k)$$

$$= \cos\varphi \cdot \{G_1^*(k)X(k) + \Delta_1^*(k)X^*(-k)\} -$$

$$j\sin\varphi \cdot \{G_2^*(k)X(k) + \Delta_2^*(k)X^*(-k)\}$$

$$= (\cos\varphi \cdot G_1^*(k) - j\sin\varphi \cdot G_2^*(k)) \cdot X(k) +$$

$$(\cos\varphi \cdot \Delta_1^*(k) - j\sin\varphi \cdot \Delta_2^*(k)) \cdot X^*(-k),$$

similarly, $$\hat{X}(-k) = \frac{1}{T}\int_0^T \hat{Y}(t)(\cos\omega_k t + j\sin\omega_k t)dt \qquad (42)$$

$$= \cos\varphi \cdot \hat{X}_1(-k) - j\sin\varphi \cdot \hat{X}_2(-k)$$

$$= \cos\varphi \cdot \{G_1(k)X(-k) + \Delta_1(k)X^*(k)\} -$$

$$j\sin\varphi \cdot \{G_2(k)X(-k) + \Delta_2(k)X^*(k)\}$$

$$= (\cos\varphi \cdot G_1(k) - j\sin\varphi \cdot G_2(k)) \cdot X(-k) +$$

$$(\cos\varphi \cdot \Delta_1(k) - j\sin\varphi \cdot \Delta_2(k)) \cdot X^*(k)$$

In general, for any k>0, there is a pair $$\hat{X}(k)=(G^*_{1c}(k)-jG^*_{2s}(k))\cdot X(k)+(\Delta^*_{1c}(k)-j\Delta^*_{2s}(k))\cdot X^*(-k), \qquad (43)$$

$$\hat{X}(-k)=(G_{1c}(k)-jG_{2s}(k))\cdot X(-k)+(\Delta_{1c}(k)-j\Delta_{2s}(k))\cdot X^*(k) \qquad (44)$$

where $G_{1c}(k)=\cos\phi\cdot G_1(k)$, $G_{2s}(k)=\sin\phi\cdot G_2(k)$, $\Delta_{1c}(k)=\cos\phi\cdot\Delta_1(k)$ and $\Delta_{2s}(k)=\sin\phi\cdot\Delta_2(k)$.

Solving the equations (43) and (44) for X(k) and X(−k):

$$\hat{X}(k) - \frac{\Delta^*_{1c}(k) - j\Delta^*_{2s}(k)}{G^*_{1c}(k) + jG^*_{2s}(k)} \cdot \hat{X}^*(-k) \qquad (45)$$

$$= \left\{(G^*_{1c}(k) - jG^*_{2s}(k)) - \frac{(\Delta^*_{1c}(k) - j\Delta^*_{2s}(k))(\Delta^*_{1c}(k) + j\Delta^*_{2s}(k))}{G^*_{1c}(k) + jG^*_{2s}(k)}\right\}X(k)$$

and $$\hat{X}(-k) - \frac{\Delta_{1c}(k) - j\Delta_{2s}(k)}{G_{1c}(k) + jG_{2s}(k)} \cdot \hat{X}^*(k) \qquad (46)$$

$$= \left\{(G_{1c}(k) - jG_{2s}(k)) - \frac{(\Delta_{1c}(k) - j\Delta_{2s}(k))(\Delta_{1c}(k) + j\Delta_{2s}(k))}{G_{1c}(k) + jG_{2s}(k)}\right\}X(-k)$$

Consider how to obtain balancing parameters for a I-Q mis-matched demodulator. Assuming that a I-Q balanced modulator is available. This modulator is used to generate modulated signals at the input of the demodulator to be I-Q balanced. Based on (43) and (44), at the output of the bank of sub-carrier demodulator:

$$\hat{X}(k)=(G^*_{1c}(k)-jG^*_{2s}(k))\cdot C(k)X(k)+(\Delta^*_{1c}(k)-j\Delta^*_{2s}(k))\cdot C^*(-k)X^*(-k) \qquad (47)$$

$$\hat{X}(-k)=(G_{1c}(k)-jG_{2s}(k))\cdot C(-k)X(-k)+(\Delta_{1c}(k)-j\Delta_{2s}(k))\cdot C^*(k)X^*(k) \qquad (48)$$

where the complex numbers C(k) and C(−k) are the channel responses to the sub-carriers $\omega+\omega_k$ and $\omega-\omega_k$, respectively, which may be different if the transmission path includes some radio and intermediate frequency stages such as mixers, band-pass filters, and IF amplifiers.

If the modulator sends signal modulated with symbols {X(k), X(−k)}={a+j0, 0+j0}, then, according to (47) and (48), at the output of the demodulator, there are two complex numbers $\hat{X}(k)=X1_k$ and $\hat{X}(-k)=X1_{-k}$, and $$X1_k=(G^*_{1c}(k)-jG^*_{2s}(k))\cdot C(k) \text{ and}$$

$$X1_{-k}=(\Delta_{1c}(k)-j\Delta_{2s}(k))\cdot C^*(k). \qquad (49)$$

Therefore, $$\frac{X1_{-k}}{X1_k^*} = \frac{X1_{-k}X1_k}{|X1_k|^2} = \frac{\Delta_{1c}(k) - j\Delta_{2s}(k)}{G_{1c}(k) + jG_{2s}(k)} \qquad (50)$$

On the other hand, the modulator may send {X(k),X(−k)}={0+j0,a+j0} and the outputs of the demodulator are $\hat{X}(k)=X2_k$ and $\hat{X}(-k)=X2_{-k}$, there are $X2_k=(\Delta^*_{1c}(k)-j\Delta^*_{2s}(k))\cdot C^*(-k)$ and $X2_{-k}=(G_{1c}(k)-jG_{2s}(k))\cdot C(-k)$.

Therefore, $$\frac{X2_k}{X1^*_{-k}} = \frac{X2_k X2_{-k}}{|X2_{-k}|^2} = \frac{\Delta^*_{1c}(k) - j\Delta^*_{2s}(k)}{G^*_{1c}(k) + jG^*_{2s}(k)} \qquad (51)$$

Once $$\Delta G(-k) = \frac{\Delta^*_{1c}(k) - j\Delta^*_{2s}(k)}{G^*_{1c}(k) + jG^*_{2s}(k)} \text{ and } \Delta G(k) = \frac{\Delta_{1c}(k) - j\Delta_{2s}(k)}{G_{1c}(k) + jG_{2s}(k)}$$

are obtained, we have the I-Q balancing basic block for the demodulator shown in FIG. 5, where the constant complex scales for the output of the basic balancing block are $$f(\Delta, G, k) = \{(G^*_{1c}(k) - jG^*_{2s}(k)) -$$

$$\frac{(\Delta^*_{1c}(k) - j\Delta^*_{2s}(k))(\Delta^*_{1c}(k) + j\Delta^*_{2s}(k))}{G^*_{1c}(k) + jG^*_{2s}(k)}\} \text{ and}$$

$$f(\Delta, G, -k) = \{(G_{1c}(k) - jG_{2s}(k)) -$$

$$\frac{(\Delta_{1c}(k) - j\Delta_{2s}(k))(\Delta_{1c}(k) + j\Delta_{2s}(k))}{G_{1c}(k) + jG_{2s}(k)}\}$$

The balancing parameters are usually fixed during normal communication processes. At the output of the balancing block, the constant complex scales can be removed by demodulating the pilot symbol or preamble symbol sent by the remote party during the communication process.

Another approach to balancing a demodulator is to use some training signal sent remotely by an I-Q balanced modulator of a remote party.

For modulators, similar results can be obtained as discussed above. Suppose there is a modulator described in FIG. 3 with I-Q imbalance such as reference phase offset, gain and group imbalance. In order to generate the desired modulating signal at the output of the modulator with modulating symbols {X(k): k=−N, ..., −k, ... k, ..., N}, $\hat{X}$(k) should be applied to the input of the modulator by introducing "cross-talks" between X(k) and X(−k). According to equation (43) and (44), there are $$X(k) = (G^*_{1c}(k) - jG^*_{2s}(k)) \cdot \tilde{X}(k) + (\Delta^*_{1c}(k) - j\Delta_{2s}(k)) \cdot \tilde{X}(-k), \quad (52)$$

$$X(-k) = (G_{1c}(k) - jG_{2s}(k)) \cdot \tilde{X}(-k) + (\Delta_{1c}(k) - j\Delta_{2s}(k)) \cdot \tilde{X}^*(k), \quad (53)$$

Solving equations (5) and (6), we have, $$X(k) - \frac{\Delta^*_{1c}(k) - j\Delta^*_{2s}(k)}{G^*_{1c}(k) + jG^*_{2s}(k)} \cdot X^*(-k) = \{(G^*_{1c}(k) - jG^*_{2s}(k)) - \frac{(\Delta^*_{1c}(k) - j\Delta^*_{2s}(k))(\Delta^*_{1c}(k) + j\Delta^*_{2s}(k))}{G^*_{1c}(k) + jG^*_{2s}(k)}\}\tilde{X}(k) \quad (54)$$

and $$X(-k) - \frac{\Delta_{1c}(k) - j\Delta_{2s}(k)}{G_{1c}(k) + jG_{2s}(k)} \cdot X^*(k) = \{(G_{1c}(k) - jG_{2s}(k)) - \frac{(\Delta_{1c}(k) - j\Delta_{2s}(k))(\Delta_{1c}(k) + j\Delta_{2s}(k))}{G_{1c}(k) + jG_{2s}(k)}\}\tilde{X}(-k) \quad (55)$$

The resulting basic balancing block for the demodulator and the modulator is shown in FIG. 5.

Using approaches similar to those in the above, the balancing above parameters can be obtained for the modulator. After appropriately scaled, $\tilde{X}$(k) and $\tilde{X}$(−k) can be obtained for the corresponding sub-carrier modulators.

FIG. 5 is a diagram illustrating the basic balancing block 265 shown in FIG. 2 according to one embodiment of the invention. The basic block 265 includes first and second balancer 510 and 530, first and second balancing parameters 520 and 540, and first and second adders/subtractors 550 and 560. The input signals to the basic block 265 are signals U(k) and U(−k) indexed symmetrically to 0. For modulators, the signals U(k) and U(−k) are the desired modulating signals modulating a pair of sub-carrier modulators whose carrier frequencies are symmetrical to the center frequency of the resulting multi-carrier composite signal. For demodulators, the signals U(k) and U(−k) are outputs of a pair of two sub-carrier demodulators whose frequencies are symmetrical to the center frequency of the multi-carrier composite signal. The output signals from the basic block 265 are W(k) and W(−k). For modulators, the signals W(k) and W(−k) are pre-distorted or pre-compensated and fed into a pair of sub-carrier modulators whose frequencies are symmetrical to the center frequency of the multi-carrier composite signal, and after properly scaled, resulting in the effects that U(k) and U(−k) are modulating the pair from view point of any remote receivers. For demodulators, the signals W(k) and W(−k) are, up to some constant complex scales, recovered original signals that modulate a pair of sub-carrier modulators of the multi-carrier composite signal from remote transmitters.

The first balancer 510 generates a first balancing signal from U(k) of index k corresponding to the k-th sub-carrier modulator/demodulator at the sub-carrier frequency k$\Delta_F$. The first subtractor 550 subtracts the first balancing signal from U(−k) of index −k. The two indices of the related signals are symmetrical with respect to index 0 which corresponds to a center frequency of the final composite multi-carrier signal. The first subtractor 550 generating a first balanced signal W(−k) of index −k corresponding to the sub-carrier frequency −k$\Delta_F$. The first balanced signal W(−k) is a first desired signal scaled by a first complex factor.

The first balancer 510 includes a first converter 512 and a first multiplier 515. The first converter 512 converts the first signal U(k) into a first complex conjugate U*(k). The first multiplier 515 multiplies the first complex conjugate U*(k) with the first balancing parameter 520 to generate the first balancing signal V(k). The first balancing parameter 520 is obtained by a training sequence as described above.

The second balancer 530 generates a second balancing signal from U(−k) of index −k. The second subtractor 560 subtracts the second balancing signal from U(k) of index k. The two indices of related signals are symmetrical with respect to index 0 that corresponds to a center frequency of the composite multi-carrier signal. The second subtractor 560 generates a second balanced signal W(k) corresponding to the sub-carrier frequency k$\Delta_F$. The second balanced signal W(k) is a second desired signal scaled by a second complex factor.

The second balancer 530 includes a second converter 532 and a second multiplier 535. The second converter 512 converts the second signal U(−k) into a second complex conjugate U*(−k). The second multiplier 535 multiplies the second complex conjugate U*(−k) with the second balancing parameter 540 to generate the second balancing signal V(−k). The second balancing parameter 540 is obtained by a training sequence as described above.

Now let's consider how to remove the I-Q imbalance effects on the 0-th sub-carrier signal for demodulators (i.e., for k=0, the sub-carrier at the center frequency of the radio multi-carrier composite signal or at the DC frequency of the baseband multi-carrier signal). According to equations (9) and (41) with k=0 or (42) with k=0, the output of the 0-th sub-carrier demodulator is a linear combination of the original modulating signal and its conjugate. Therefore, without loss of generality, we can assume $$\hat{X}(0) = G^*(0)X(0) + \Delta(0)X^*(0) \quad (56)$$

where G*(0) and $\Delta$(0) are two complex numbers depending on the I-Q imbalance conditions of the I-Q demodulator at DC.

Solving equation (56), we obtain $$G(0)\hat{X}(0) - \Delta(0)\hat{X}^*(0) = (|G(0)|^2 - |\Delta(0)|^2)X(0) \quad (57)$$

or $$\hat{X}(0) - \frac{\Delta(0)}{G(0)}\hat{X}^*(0) = G^*(0)\left(1 - \left|\frac{\Delta(0)}{G(0)}\right|^2\right)X(0) \quad (58)$$

In this case, two identified inputs are applied to the basic balancing block in FIG. 5 and only one output is needed. Therefore only one branch in FIG. 5 is needed to generate the resulting balanced signal with one balancing signal and one balancing parameter and the other branch is redundant.

To obtain the balancing parameter for the 0-th sub-carrier signal, the training signal source needs to send two training signals for the 0-th sub-carrier demodulator. The first training signal contains the 0-th sub-carrier signal modulated by X(0)=$C_0$ where $C_0$ is any given non-null complex number, and, according to equation (56), the output of the 0-th sub-carrier demodulator is $$X1 = G^*(0)C_0 + \Delta(0)C^*_0 \quad (59)$$

The second training signal contains the 0-th sub-carrier signal modulated by X(0)=j$C_0$ (i.e., 90 degree phase shift of the first modulating signal), and, according to equation (56), the output of the 0-th sub-carrier demodulator is $$X2 = G^*(0)jC_0 - \Delta(0)jC^*_0 \tag{60}$$

Combining equations (59) and (60), we obtain $$X1 - jX2 = 2 \cdot G^*(0)C_0 \text{ and } X1 + jX2 = 2 \cdot \Delta(0)C^*_0.$$

Therefore, $$\frac{X1 + jX2}{(X1 - jX2)^*} = \frac{X1 + jX2}{(X1^* + jX2^*)} = \frac{\Delta(0)}{G(0)} \tag{61}$$

Similar results can be obtained for modulator. There are $$X(0) = G^*(0)\hat{X}(0) + \Delta(0)\hat{X}^*(0),$$

$$G(0)X(0) - \Delta(0)X^*(0) = (|G(0)|^2 - \Delta(0)|^2)\tilde{X}(0)$$

and $$\tilde{X}(0) - \frac{\Delta(0)}{G(0)}\tilde{X}^*(0) = G(0)\left(1 - \left|\frac{\Delta(0)}{G(0)}\right|^2\right)X(0).$$

The balancing parameter can be obtained in a similar way to the one used for demodulators.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. An apparatus comprising:
   a first balancer to generate a first balancing signal from a first balancing parameter and a first signal of a first index corresponding to a first frequency, the first balancing parameter being calculated in a training process and the first signal being provided by a first sub-carrier demodulator operating at the first frequency; and
   a first combiner coupled to the first balancer to combine the first balancing signal and a second signal of a second index corresponding to a second frequency, the second frequency being symmetrical to the first frequency with respect to a center frequency in a multi-carrier signal, the first combiner generating a first balanced signal corresponding to the second frequency.

2. The apparatus of claim 1 wherein the first balancer comprises:
   a first converter to convert the first signal into a first complex conjugate; and
   a first multiplier coupled to the first converter to multiply the first complex conjugate with the first balancing parameter, the first balancing parameter corresponding to the first frequency, the first multiplier generating the first balancing signal.

3. The apparatus of claim 1 wherein the first combiner includes a first subtractor to subtract the first balancing signal from the second signal to provide the first balanced signal.

4. The apparatus of claim 1 wherein the first balanced signal is the same as a first desired signal free of imbalance effects, excluding scaling by a first deterministic complex factor.

5. The apparatus of claim 4 wherein the first desired signal is an ideally demodulated signal free of imbalance effects.

6. The apparatus of claim 1 further comprising:
   a second balancer to generate a second balancing signal from a second balancing parameter and the second signal, the second balancing parameter being calculated in a training process; and
   a second combiner coupled to the second balancer to combine the second balancing signal with the first signal at a second frequency, the second combiner generating a second balanced signal at the first frequency.

7. The apparatus of claim 6 wherein the second balancer comprises:
   a second converter to convert the second signal into a second complex conjugate; and
   a second multiplier coupled to the second converter to multiply the second complex conjugate with the second balancing parameter, the second balancing parameter corresponding to the second frequency, the second multiplier generating the second balancing signal.

8. The apparatus of claim 6 wherein the second combiner includes a second subtractor to subtract the second balancing signal from the first signal to provide the second balanced signal.

9. The apparatus of claim 6 wherein the second balanced signal is the same as a second desired signal free of imbalance effects, excluding scaling by a second deterministic complex factor.

10. The apparatus of claim 9 wherein the second desired signal is ideally demodulated signal free of imbalance effects.

11. The apparatus of claim 6 wherein the second signal is provided by a second sub-carrier demodulator operating at the second frequency.

12. The apparatus of claim 6 wherein the second balancing parameter is a ratio between an output of a first sub-carrier demodulator and a conjugate output of a second sub-carrier demodulator when the multi-carrier signal contains a first sub-carrier signal modulated by a null complex number and a second sub-carrier signal modulated by a non-null complex number during the training process.

13. The apparatus of claim 6 wherein the first balanced signal is provided to a second sub-carrier modulator operating at the second frequency and the second balanced signal is provided to a first sub-carrier modulator operating at the first frequency.

14. The apparatus of claim 13 wherein:
   the first combiner includes a first subtractor coupled to the first balancer to subtract the first balancing signal from the second signal at a first frequency, the first subtractor generating the first balanced signal at the second frequency; and
   the second combiner including a second subtractor coupled to the second balancer to subtract the second balancing signal from the first signal at a second frequency, the second subtractor generating the second balanced signal at the first frequency.

15. The apparatus of claim 14 further wherein:
   the first balancer comprises:
      a first converter to convert the first signal into a first complex conjugate; and
      a first multiplier coupled to the first converter to multiply the first complex conjugate with the first balancing parameter, the first balancing parameter corresponding to the first frequency, the first multiplier generating the first balancing signal;

and the second balancer comprises:
- a second converter to convert the second signal into a second complex conjugate; and
- a second multiplier coupled to the second converter to multiply the second complex conjugate with a second balancing parameter, the second balancing parameter corresponding to the second frequency, the second multiplier generating the second balancing signal.

16. The apparatus of claim 15 wherein the first balanced signal and the second balanced signal are a first pre-distorted signal and a second pre-distorted signal, respectively.

17. The apparatus of claim 16 wherein the first pre-distorted signal and the second pre-distorted signal are provided to a second sub-carrier modulator operating at the second frequency and a first sub-carrier modulator operating at the first frequency, respectively.

18. The apparatus of claim 17 wherein the first balancing parameter is derived from outputs of first and second ideal sub-carrier demodulators operating at first and second frequencies when the multi-carrier signal is generated from the first and second sub-carrier modulators modulated by the first and second desired signal, the first desired signal being a non-null complex number and the second desired signal being a null complex number during the training process.

19. The apparatus of claim 17 wherein the second balancing parameter is derived from outputs of first and second ideal sub-carrier demodulators operating at first and second frequencies when the multi-carrier signal is generated from the first and second sub-carrier modulators modulated by the first and second desired signal, the first desired signal being a null complex number and the second desired signal being a non-null complex number during the training process.

20. The apparatus of claim 1 wherein the first balancing parameter is a ratio between an output of a second sub-carrier demodulator and a conjugate output of a first sub-carrier demodulator when the multi-carrier signal contains a first sub-carrier signal modulated by a non-null complex number and a second sub-carrier signal modulated by a null complex number during the training process.

21. The apparatus of claim 1 wherein the first signal and the second signal are a first desired signal and a second desired signal to be transmitted, respectively.

22. The apparatus of claim 1 wherein at least one of the first and second indices corresponds to a zero index.

23. The apparatus of claim 22 wherein at least one of the first and second signals corresponds to one of the center frequency and a DC of a baseband signal of the multi-carrier signal.

24. A method comprising:
- calculating a first balancing parameter in a training process;
- generating a first balancing signal from a first balancing parameter and a first signal of a first index corresponding to a first frequency using a first balancer, the first signal being provided by a first sub-carrier demodulator operating at the first frequency; and
- combining the first balancing signal and a second signal of a second index corresponding to a second frequency using a first combiner, the second signal being provided by a second sub-carrier demodulator operating at the second frequency and the second frequency being symmetrical to the first frequency with respect to a center frequency in a multi-carrier signal, the first combiner generating a first balanced signal corresponding to the second frequency.

25. The method of claim 24 wherein generating a first balancing signal comprises:
- converting the first signal into a first complex conjugate by a first converter; and
- multiplying the first complex conjugate with the first balancing parameter by a first multiplier, the first balancing parameter corresponding to the first frequency, the first multiplier generating the first balancing signal.

26. The method of claim 24 wherein the first combiner includes a first subtractor to subtract the first balancing signal from the second signal to provide the first balanced signal.

27. The method of claim 24 wherein the first balanced signal is the same as a first desired signal free of imbalance effects, excluding scaling by a first deterministic complex factor.

28. The method of claim 27 wherein the first desired signal is a first ideally demodulated signal free of imbalance effects.

29. The method of claim 28 further comprising:
- calculating a second balancing parameter in a training process;
- generating a second balancing signal from a second balancing parameter and the second signal using a second balancer; and
- combining the second balancing signal with the first signal at a second frequency using a second combiner, the second combiner generating a second balanced signal at the first frequency.

30. The method of claim 29 wherein generating the second balancing signal comprises:
- converting the second signal into a second complex conjugate by a second converter; and
- multiplying the second complex conjugate with the second balancing parameter by a second multiplier, the second balancing parameter corresponding to the second frequency, the second multiplier generating the second balancing signal.

31. The method of claim 29 wherein the second combiner includes a second subtractor to subtract the second balancing signal from the first signal to provide the second balanced signal.

32. The method of claim 29 wherein the second balanced signal is the same as a second desired signal free of imbalance effects, excluding scaling by a second deterministic complex factor.

33. The method of claim 32 wherein the second desired signal is a second ideally demodulated signal free of imbalance effects.

34. The method of claim 29 wherein calculating the second balancing parameter results in a complex number derived from outputs of the first and second sub-carrier demodulators when the received multi-carrier signal contains a first sub-carrier signal modulated by a null complex number and a second sub-carrier signal modulated by a non-null complex number during the training process.

35. The method of claim 24 wherein calculating the first balancing parameter results in a complex number derived from outputs of the first and second sub-carrier demodulators when the received multi-carrier signal contains a first sub-carrier signal modulated by a non-null complex number and a second sub-carrier signal modulated by a null complex number during the training process.

36. A method comprising:
calculating a first balancing parameter in a training process;
generating a first balancing signal from a first balancing parameter and a first signal of a first index corresponding to a first frequency using a first balancer, the first signal being a first desired signal to be transmitted;
and combining the first balancing signal and a second signal of a second index corresponding to a second frequency using a first combiner, the second frequency being symmetrical to the first frequency with respect to a center frequency in a multi-carrier signal, the first combiner generating a first balanced signal corresponding to the second frequency.

37. The method of claim 36 wherein the first balanced signal is provided to a sub-carrier modulator operating at the second frequency.

38. The method of claim 36 further comprising:
generating a second balancing signal from the second signal by a second balancer; and
combining the second balancing signal and the first signal at a second frequency by a second combiner, the second combiner generating a second balanced signal at the first frequency.

39. The method of claim 38 wherein generating the first and second balancing signals comprises:
converting the first signal into a first complex conjugate by a first converter; multiplying the first complex conjugate with a first balancing parameter by a first multiplier, the first balancing parameter corresponding to the first frequency, the first multiplier generating the first balancing signal;
converting the second signal into a second complex conjugate by a second converter; and
multiplying the second complex conjugate with a second balancing parameter by a second multiplier, a second balancing parameter corresponding to the second frequency, the second multiplier generating the second balancing signal.

40. The method of claim 39 wherein the second signal is a second desired signal to be transmitted.

41. The method of claim 40 wherein the first balancing parameter is derived from outputs of first and second ideal sub-carrier demodulators operating at first and second frequencies when the multi-carrier signal is generated from a sub-carrier modulator operating at the first frequency and a sub-carrier modulator operating at the second frequency being modulated by the first and second desired signals, respectively, the first desired signal being a non-null complex number and the second desired signal being a null complex number during the training process.

42. The method of claim 40 wherein the second balancing parameter is derived from outputs of first and second ideal sub-carrier demodulators operating at first and second frequencies when the multi-carrier signal is generated from sub-carrier modulator operating at the first frequency and a sub-carrier modulator operating at the second frequency being modulated by the first and second desired signals respectively, the first desired signal being a null complex number and the second desired signal being a non-null complex number during the training process.

43. The method of claim 38 wherein the second balanced signal is provided to a sub-carrier modulator operating at the first frequency.

44. A system comprising:
in-phase (I) and quadrature (Q) processing chains to generate I and Q samples from a multi-carrier signal having 2P sub-carrier signals at 2P carrier frequencies;
a bank of demodulators coupled to the I and Q processing chains to demodulate the 2P sub-carrier signals, the bank of demodulators generating 2P demodulated signals; and
a balancing unit coupled to the bank of demodulators to restore 2P original signals from the 2P demodulated signals, the balancing unit including P basic blocks, each of the basic blocks being coupled to a pair of the demodulators called the first and second sub-carrier demodulators of the basic block and comprising:
a first balancer to generate a first balancing signal from a first signal at a first frequency, and
a first combiner coupled to the first balancer to combine the first balancing signal and a second signal at a second frequency, the second frequency being symmetrical to the first frequency with respect to a center frequency in the multi-carrier signal, the first combiner generating a first balanced signal at the second frequency.

45. The system of claim 44 wherein the first balancer comprises:
a first converter to convert the first signal into a first complex conjugate; and
a first multiplier coupled to the first converter to multiply the first complex conjugate with a first balancing parameter, the first balancing parameter corresponding to the first frequency, the first multiplier generating the first balancing signal.

46. The system of claim 45 wherein the first balancing parameter is derived from outputs of the first and second sub-carrier demodulators when the multi-carrier signal contains a first sub-carrier signal modulated by a non-null complex number and a second sub-carrier signal modulated by a null complex number during a training process.

47. The system of claim 44 wherein the first combiner includes a first subtractor to subtract the first balancing signal from the second signal to provide the first balanced signal.

48. The system of claim 44 wherein the first balanced signal is a first desired signal scaled by a first complex factor.

49. The system of claim 48 wherein the first signal is provided by a first sub-carrier demodulator operating at the first frequency.

50. The system of claim 49 wherein the first desired signal is a first original signal.

51. The system of claim 50 wherein each of the basic blocks further comprising:
a second balancer to generate a second balancing signal from the second signal; and
a second combiner coupled to the second balancer to combine the second balancing signal with the first signal at a second frequency, the second combiner generating a second balanced signal at the first frequency.

52. The system of claim 51 wherein the second balancer comprises:
a second converter to convert the second signal into a second complex conjugate; and
a second multiplier coupled to the second converter to multiply the second complex conjugate with a second balancing parameter, the second balancing parameter corresponding to the second frequency, the second multiplier generating the second balancing signal.

53. The system of claim 52 wherein the second balancing parameter is derived from outputs of the first and second sub-carrier demodulators when the multi-carrier signal contains a first sub-carrier signal modulated by a null complex number and a second sub-carrier signal modulated by a non-null complex number during a training process.

54. The system of claim 51 wherein the second combiner includes a second subtractor to subtract the second balancing signal from the first signal to provide the second balanced signal.

55. The system of claim 51 wherein the second balanced signal is a second desired signal scaled by a second complex factor.

56. The system of claim 55 wherein the second signal is provided by a second sub-carrier demodulator operating at the second frequency.

57. The system of claim 56 wherein the second desired signal is a second original signal.

58. A system comprising:
   in-phase (I) and quadrature (Q) processing chains using I and Q samples to generate a multi-carrier signal having 2P sub-carrier signals at 2P carrier frequencies;
   a bank of 2P modulators generating 2P modulated signals of the 2P sub-carriers and the resulting I and Q samples to feed the I and Q processing chains; and
   a balancing unit generating 2P pre-distorted signals from 2P desired signals and using the 2P pre-distorted signals to modulate the 2P sub-carriers of the bank of 2P modulators, the balancing unit including P basic blocks, each of the basic blocks being coupled to a pair of the modulators called the first and second sub-carrier modulators of the basic block and comprising:
   a first balancer to generate a first balancing signal from a first signal at a first frequency, and a first combiner coupled to the first balancer to combine the first balancing signal and a second signal at a second frequency, the second frequency being symmetrical to the first frequency with respect to a center frequency in the multi-carrier signal, the first combiner generating a first balanced signal at the second frequency.

59. The system of claim 58 wherein the first signal is a first desired signal to be transmitted and the first balanced signal is the first pre-distorted signal provided to the second sub-carrier modulator operating at the second frequency.

60. The system of claim 59 wherein the second signal is a second desired signal to be transmitted.

61. The system of claim 58 further comprising:
   a second balancer to generate a second balancing signal from the second signal; and
   a second combiner coupled to the second balancer to subtract the second balancing signal from the first signal at a second frequency, the second combiner generating the second balanced signal at the first frequency.

62. The system of claim 61 wherein the second balanced signal is the second pre-distorted signal provided to the first sub-carrier modulator operating at the first frequency.

63. The system of claim 58 further comprising:
   a first converter to convert the first signal into a first complex conjugate;
   a first multiplier coupled to the first converter to multiply the first complex conjugate with a first balancing parameter, the first balancing parameter corresponding to the first frequency, the first multiplier generating the first balancing signal;
   a second converter to convert the second signal into a second complex conjugate; and
   a second multiplier coupled to the second converter to multiply the second complex conjugate with a second balancing parameter, the second balancing parameter corresponding to the second frequency, the second multiplier generating the second balancing signal.

64. The system of claim 63 wherein the first and second balancing parameters are obtained during a training process.

65. The system of claim 64 wherein the first balancing parameter is derived from outputs of first and second sub-carrier ideal demodulators operating at first and second frequencies when the multi-carrier signal is generated from the first and second sub-carrier modulators modulated by the first and second desired modulating signals, the first desired signal being a non-null complex number and the second desired signal being a null complex number during the training process.

66. The system of claim 64 wherein the second balancing parameter is derived from outputs of first and second sub-carrier ideal demodulators operating at first and second frequencies when the multi-carrier signal is generated from the first and second sub-carrier modulators modulated by the first and second desired modulating signals, the first desired signal being a null complex number and the second desired signal being a non-null complex number during the training process.

* * * * *